United States Patent [19]

Gambino et al.

[11] Patent Number: 5,298,784
[45] Date of Patent: Mar. 29, 1994

[54] ELECTRICALLY PROGRAMMABLE ANTIFUSE USING METAL PENETRATION OF A JUNCTION

[75] Inventors: Jeffrey P. Gambino, Gaylordsville, Conn.; Dominic J. Schepis, Wappingers Falls; Krishna Seshan, Beacon, both of N.Y.

[73] Assignee: International Business Machines Corporation, Armonk, N.Y.

[21] Appl. No.: 858,835

[22] Filed: Mar. 27, 1992

[51] Int. Cl.$^5$ .................................. H01L 23/48
[52] U.S. Cl. ................... 257/529; 257/530; 257/751; 257/771; 257/768
[58] Field of Search ............... 257/530, 529, 751, 765, 257/768, 769, 770, 771

[56] References Cited

U.S. PATENT DOCUMENTS

| | | | |
|---|---|---|---|
| 4,312,046 | 1/1982 | Taylor | 365/104 |
| 4,491,857 | 1/1985 | McElroy | 357/23 |
| 4,670,970 | 6/1987 | Bajor | 29/584 |
| 4,727,409 | 2/1988 | Conner et al. | 257/530 |
| 4,748,490 | 5/1988 | Hollingsworth | 357/51 |
| 4,876,220 | 10/1989 | Mohsen et al. | 437/170 |
| 4,881,114 | 11/1989 | Mohsen et al. | 357/54 |
| 4,899,205 | 2/1990 | Hamdy et al. | 357/51 |
| 4,914,055 | 4/1990 | Gordon et al. | 437/192 |
| 4,931,353 | 6/1990 | Tanielian | 437/200 |
| 4,943,538 | 7/1990 | Mohsen et al. | 437/52 |
| 4,961,102 | 10/1990 | Shideler et al. | 257/530 X |
| 5,019,878 | 5/1991 | Yang et al. | 357/23.3 |

FOREIGN PATENT DOCUMENTS

0452090A3 10/1991 European Pat. Off. .
0452090A2 10/1991 European Pat. Off. .
0452091A3 10/1991 European Pat. Off. .
0452091A2 10/1991 European Pat. Off. .
3927033A1 3/1990 Fed. Rep. of Germany .

OTHER PUBLICATIONS

Fu, et al., "On the Failure Mechanisms of Titanium Nitride/Titanium Silicide Barrier Contacts under High Current Stress", I.E.E.E. Transactions on Electron Devices, vol. 35, No. 12, Dec. 1988, pp. 2151–2159.

C. M. Hsieh & H. R. Wilson, "Electrically Programmable Transistor Pipes," IBM Technical Disclosure, vol. 24, pp. 3478–3479.

Kuan-Yu Fu & Ronald E. Pyle, "On the Failure Mechanisms of Titanium Nitride/Titanium Silicide Barrier Contacts under High Current Stress," IEEE Transactions on Electron Devices, vol. 35, No. 12, Dec. 1988, pp. 2151–2159.

Primary Examiner—William Mintel
Attorney, Agent, or Firm—Whitham & Marhoefer

[57] ABSTRACT

An improved antifuse uses metal penetration of either a P-N diode junction or a Schottky diode. The P-N junction, or Schottky diode, is contacted by a diffusion barrier such as TiN, W, Ti-W alloy, or layers of Ti and Cr, with a metal such as Al. Al-CU alloy, Cu, Au, or Ag on top of the diffusion barrier. When this junction is stressed with voltage pulse producing a high current density, severe joule heating occurs resulting in metal penetration of the diffusion barrier and the junction. The voltage drop across the junction decreases by about a factor of ten after the current stress and is stable thereafter. Alternatively, a shallow P-N junction in a silicon substrate is contacted by a layer of metal that forms a silicide, such as Ti, Cr, W, Mo, or Ta. Stressing the junction with a voltage pulse to produce a high current density results in the metal penetrating the junction and reacting with the substrate to form a silicide.

20 Claims, 2 Drawing Sheets

ELECTRICALLY PROGRAMMABLE ANTIFUSE USING METAL PENETRATION OF A JUNCTION

BACKGROUND OF THE INVENTION

1. Field of the Invention

The present invention generally relates to integrated circuit (IC) structures and, more particularly, to an improved antifuse structure for use in programming redundant and customizable IC chips.

2. Description of the Prior Art

Fuses are used in integrated circuits (ICs) to disconnect defective regions of a chip, thereby making the chip usable. For example, redundancy in integrated circuit memories is part of current wafer and chip manufacturing strategy to improve yield. The practice is to blow fuses which allow extra memory cells to be used in place of cells that are non-functional. In addition, fuses are used, for example, in programmable logic arrays (PLAS) and similar structures to form semi-custom circuits.

Antifuses are devices that have a lower resistance after programming than initially. Antifuses, like fuses, are used both in redundant IC structures and to form semi-custom circuits. An antifuse using junction breakdown in a bipolar transistor has been described by C. M. Hsieh and H. R. Wilson in "Electrically Programmable Transistor Pipes", *IBM Technical Disclosure Bulletin*, vol. 24, No. 7A, pp. 3478 and 3479 (1981).

U.S. Pat. No. 5,019,878 to Yang et al. discloses a programmable interconnect using a silicided MOS transistor. The transistor is formed at a face of a semiconductor layer and includes a diffused drain region and a source region that are spaced apart by a channel region. The drain region has a surface with a silicided layer. The application of a programming voltage in the range of ten to fifteen volts from the drain region to the source region forms a melt filament across the channel region. Programming is controlled by applying or not applying a gate voltage over the channel region.

The Yang et al. programmable interconnect is only suitable for field effect transistor (FET) structures because it is itself an FET device requiring the number and type of processing steps of FET structures. Moreover, it has a disadvantage of requiring a relative high program voltage (e.g., ten to fifteen volts) which, in a high density IC device, risks localized damage to other structures in the region.

K.-Y. Fu and R. E. Pyle, in "On the Failure Mechanisms of Titanium Nitride/Titanium Silicide Barrier Contacts under High Current Stress", *IEEE Transactions on Electron Devices*, vol. 35, no. 12, pp. 2151–2159 (1988), have described a failure mechanism caused by electrically stressing a P-N junction contacted by Al/-TiN/TiSi$_2$ metallurgy. At high current densities, joule heating occurs in the Si substrate, which causes the Al to penetrate the TiN and TiSi$_2$ layers and spike the junction. However, there is no recognition by the authors that this phenomenon could be used in a positive way.

What is needed is an antifuse of simple construction having application to both FET and bipolar structures. The antifuse should also be programmable using low voltages to minimize the possibility of thermal damage to other structures in the region of the antifuse.

SUMMARY OF THE INVENTION

It is therefore an object of the present invention to provide an improved antifuse structure which is simple to fabricate and has general application to both FET and bipolar IC structures.

It is another object of the invention to provide an antifuse structure which occupies a minimal area of an IC chip and can be programmed with low voltages making it suitable to high density IC structures.

According to the invention, there is provided an antifuse by metal penetration of either a P-N junction or a Schottky diode. As used herein, it will be understood by those skilled in the art that a P-N junction is equivalent to an N-P junction. In one embodiment, a P-N junction or Schottky diode is contacted by a diffusion barrier such as TiN, W, Ti-W alloy, or separate layers of Ti and Cr, with a metal such as Al, Al-CU alloy, Cu, Au, or Ag on top of the diffusion barrier. When P-N junctions are stressed at high current densities (e.g., $1 \times 10^6$ A/cm$^2$), severe joule heating occurs resulting in metal penetration of the diffusion barrier and the junction. The voltage drop across the junction decreases by about a factor of ten after the current stress, and this condition is stable. In another embodiment, a shallow junction is contacted by a metal that forms silicides, such as Ti, Cr, W, Mo, and Ta. At a sufficiently high current stress, joule heating will result in silicide formation and junction penetration. The metal thickness is chosen such that the silicide thickness is greater than the junction depth.

An important consideration in designing an electrically programmable antifuse is to minimize the programming voltage in order to avoid damaging other devices in the circuit. The programming voltage can be minimized in three ways; by electrically and thermally isolating the antifuse, by maximizing the current density, and by using a voltage pulse rather than ramping the voltage. Electrical and thermal isolation can be achieved by surrounding the junction with a good insulator such as SiO$_2$ and by minimizing the dimensions of the electrical conductors (which are also good thermal conductors) on top of the junction. The current density is maximized by making the area of the junction as small as possible.

The antifuses according to the invention can be implemented in most integrated circuits with few or no additional process steps. An advantage of this approach compared to the junction breakdown approach of Yang et al. is that the temperature required for metal penetration is less than for junction breakdown which requires local melting of Si.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
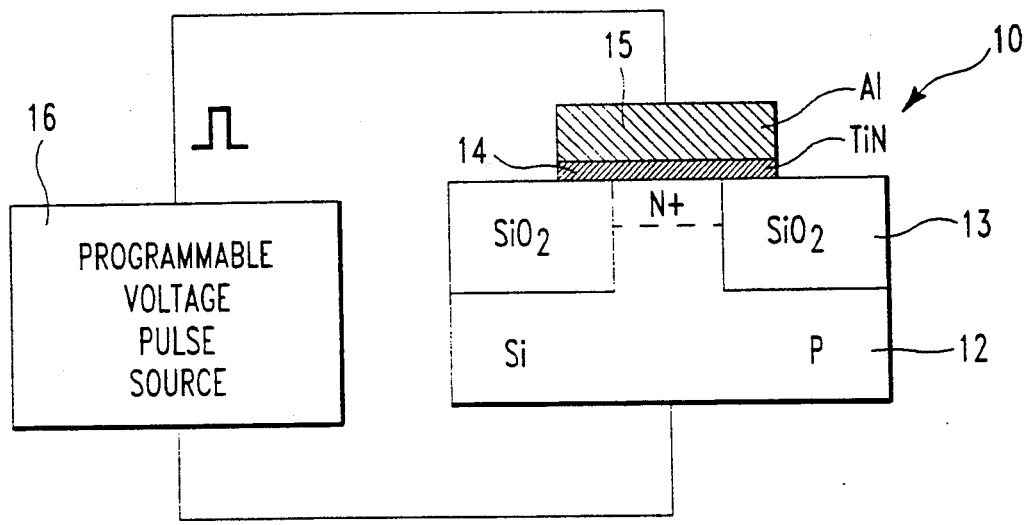
FIG. 1 is a cross-sectional view of a first embodiment of the antifuse according to the invention prior to programming.

Referring now to the drawings, and more particularly to FIG. 1, there is shown the structure of a first embodiment of the antifuse 10 according to the invention. A diode P-N junction or Schottky diode 11 is formed in a silicon substrate 12. The junction 11 is surrounded by an electrical isolation structure 13 which also serves to thermally isolate the junction. While any isolation structure can be used, trench isolation using $SiO_2$ is preferred to maximize the isolation of the device. The P-N junction 11 is exposed by a hole in an $SiO_2$ isolation structure 13. The junction is contacted by a diffusion barrier 14, such as TiN, W, Ti-W alloy, or layers of Ti and Cr, with a layer 15 of a metal such as Al, Al-Cu alloy, Cu, Au, or Ag on top of the diffusion barrier 14. In a specific implementation of the invention, the diffusion layer 14 is TiN and the metal layer is Al. A programmable source of voltage pulses 16 is connected to the metal layer 15 and to the silicon substrate 12.

Figure 2:
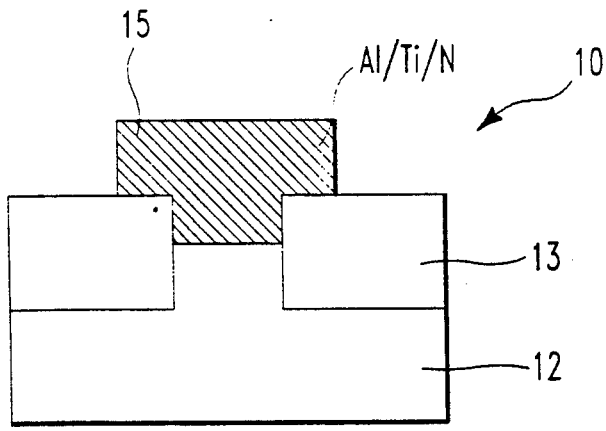
FIG. 2 is a cross-sectional view of the antifuse of FIG. 1 after programming.

When the P-N junction 11 is stressed by a voltage pulse from the programmable source 16, high current densities (e.g., $1 \times 10^6$ A/cm$^2$) are produced causing severe joule heating that results in metal penetration of the diffusion barrier 14 and the junction itself, as shown in FIG. 2. The voltage drop across the junction decreases by about a factor of ten after the current stress, and this condition is stable.

Figure 3:
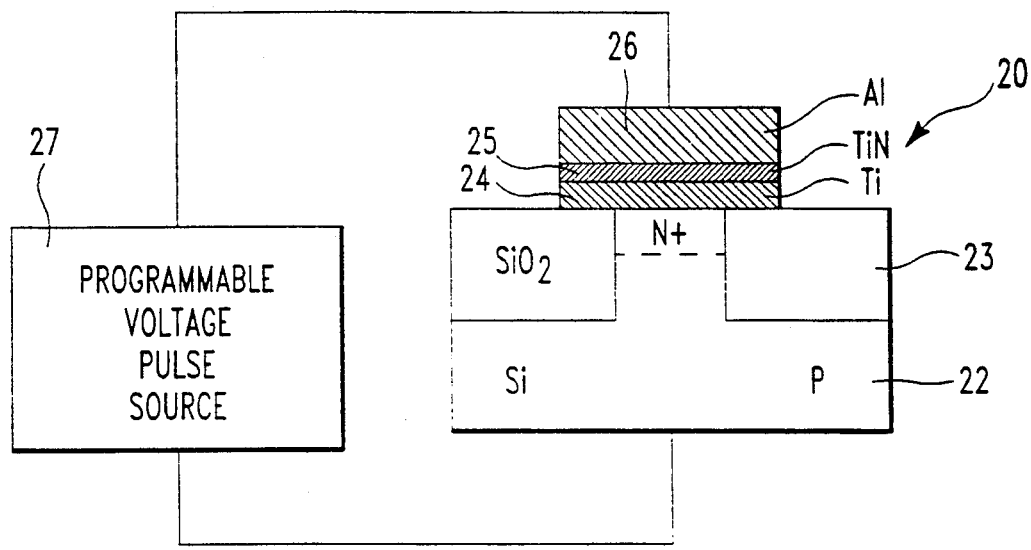
FIG. 3 is a cross-sectional view of a second embodiment of the antifuse according to the invention prior to programming.

In another embodiment shown in FIG. 3, the antifuse 20 is comprised of a shallow P-N diode junction 21 in a silicon substrate 22. As in the structure shown in FIG. 1, the P-N junction 21 is surrounded by an isolation structure 23 formed by filling a trench with $SiO_2$. The P-N junction 21 is exposed by a hole in the isolation structure 23 of $SiO_2$. The junction 21 is contacted by a layer 24 of a metal which will form silicides. Such metals include Ti, Cr, W, Mo, and Ta. In a specific implementation of the invention, the metal layer 24 is Ti. The metal layer 24 may have a diffusion barrier 25, such as TiN, with a layer 26 of Al on top of the TiN. A programmable source of voltage pulses 27 is connected to the metal layer 26 and to the silicon substrate 22.

Figure 4:
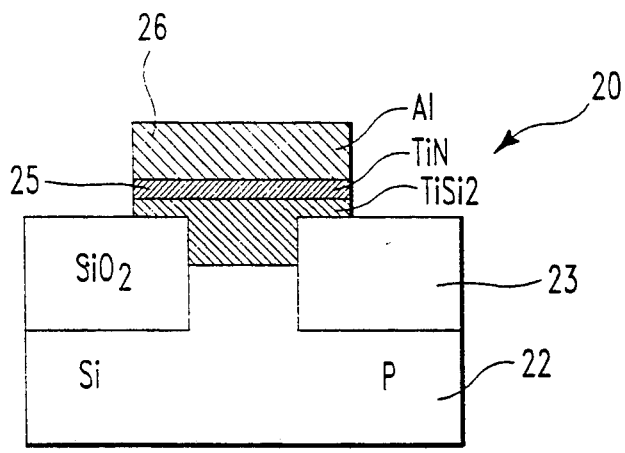
FIG. 4 is a cross-sectional view of the antifuse of FIG. 3 after programming.

At a sufficiently high current stress due to a sharp voltage pulse from the programmable source 27, joule heating results in silicide formation and junction penetration, as shown in FIG. 4. The thickness of layer 24 is chosen such that the silicide thickness is greater than the junction depth.

While the invention has been described in terms of two preferred embodiments, those skilled in the art will recognize that the invention can be practiced with modification within the spirit and scope of the appended claims.

We claim:

1. An electrically programmable antifuse comprising:
   a silicon substrate;
   a diode P-N junction formed in said silicon substrate;
   isolation means for electrically and thermally isolating said P-N junction in said silicon substrate, said P-N junction being exposed through said isolation means;
   a metal diffusion barrier over said P-N junction;
   a metal layer over said diffusion barrier; and
   programmable pulse generating means connected across said metal layer and said silicon substrate for stressing said P-N junction by a voltage pulse to produce a prescribed current density and creating a prescribed joule heating resulting in metal layer penetration into said P-N junction to thereby program said antifuse to conduct at prescribed voltages.

2. The antifuse recited in claim 1 wherein said isolation means comprises a trench in said substrate surrounding said P-N junction and filled with $SiO_2$.

3. The antifuse recited in claim 2 wherein said diffusion barrier is selected from the group consisting of TiN, W, Ti-W alloy, and layers of Ti and Cr, and said metal layer is composed of a metal selected from the group consisting of Al, Al-Cu alloy, Cu, Au, and Ag.

4. The antifuse recited in claim 3 wherein said diffusion layer is TiN and said metal layer is Al.

5. An electrically programmable semiconductor antifuse comprising:
   a silicon substrate;
   a diode P-N junction formed in said silicon substrate;
   isolation means for electrically and thermally isolating said P-N junction in said silicon substrate, said P-N junction being exposed through said isolation means;
   a metal layer over said P-N junction, said metal layer for reacting with said silicon substrate to form a silicide penetrating into said P-N junction; and
   programmable pulse generating means connected across said metal layer and said silicon substrate for stressing said P-N junction by a voltage pulse to produce a prescribed current density and creating a prescribed joule heating resulting in said silicide formation and penetration into said P-N junction to thereby program said antifuse to conduct at prescribed voltages.

6. The antifuse recited in claim 5 wherein said isolation means comprises a trench in said substrate surrounding said P-N junction and filled with $SiO_2$.

7. The antifuse recited in claim 6 wherein said metal layer is composed of a metal chosen from the group consisting of Ti, Cr, W, Mo, and Ta.

8. The antifuse recited in claim 7 wherein said metal is Ti.

9. The antifuse recited in claim 8 further comprising a TiN diffusion barrier over said metal and an Al layer over said TiN diffusion barrier.

10. An electrically programmable semiconductor antifuse programmable under prescribed joule heating programming conditions and which conducts at prescribed voltages when programmed, said antifuse comprising:
    a) a silicon substrate;
    b) a diode P-N junction formed in said silicon substrate;
    c) isolation means for electrically and thermally isolating said P-N junction in said silicon substrate, said P-N junction being exposed through said isolation means; and
    d) a metal layer over said P-N junction, said metal layer for reacting with said silicon substrate to form a silicide penetrating into said P-N junction when said antifuse is programmed, said metal layer being composed of a metal chosen from the group consisting of Ti, Cr, W, Mo, and Ta.

11. The antifuse recited in claim 10, wherein said isolation means comprises a trench in said substrate surrounding said P-N junction and filled with $SiO_2$.

12. The antifuse recited in claim 10, wherein said metal is Ti.

13. The antifuse recited in claim 12, further comprising a TiN diffusion barrier over said metal layer and an Al layer over said TiN diffusion barrier.

14. An electrically programmable semiconductor antifuse programmable under prescribed joule heating programming conditions and which conducts at prescribed voltages when programmed, said antifuse comprising:
 a) a silicon substrate;
 b) a diode formed in said silicon substrate;
 c) isolation means for electrically and thermally isolating said diode in said silicon substrate, said diode being exposed through said isolation means; and
 d) a metal layer over said diode, said metal layer for reacting with said silicon substrate to form a silicide penetrating into said diode when said antifuse is programmed, said metal layer being composed of a metal chosen from the group consisting of Ti, Cr, W, Mo, and Ta.

15. The antifuse recited in claim 14, wherein said diode comprises a Schottky diode.

16. The antifuse recited in claim 14, wherein said diode comprises a P-N junction.

17. An electrically programmable antifuse programmable under prescribed joule heating programming conditions and which conducts at prescribed voltages when programmed, said antifuse comprising:
 a) a silicon substrate;
 b) a diode P-N junction formed in said silicon substrate;
 c) isolation means for electrically and thermally isolating said P-N junction in said silicon substrate, said P-N junction being exposed through said isolation means;
 d) a metal diffusion barrier over said P-N junction; and
 e) a metal layer over said diffusion barrier, said metal layer for reacting i) with said diffusion barrier to penetrate therethrough and ii) with said silicon substrate to penetrate into said P-N junction, when said antifuse is programmed.

18. The antifuse recited in claim 17, wherein said isolation means comprises a trench in said substrate surrounding said P-N junction and filled with $SiO_2$.

19. The antifuse recited in claim 17, wherein said diffusion barrier is selected from the group consisting of TiN, W, Ti-W alloy, and layers of Ti and Cr, and
 said metal layer is composed of a metal selected from the group consisting of Al, Al-Cu alloy, Cu, Au, and Ag.

20. The antifuse recited in claim 19, wherein said diffusion barrier is TiN and said metal layer is Al.

* * * * *